US011948822B2

(12) United States Patent
Li et al.

(10) Patent No.: US 11,948,822 B2
(45) Date of Patent: Apr. 2, 2024

(54) SUBSTRATE TRANSFER DEVICE AND SUBSTRATE PROCESSING SYSTEM

(71) Applicant: Tokyo Electron Limited, Tokyo (JP)

(72) Inventors: Dongwei Li, Nirasaki (JP); Takehiro Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 226 days.

(21) Appl. No.: 17/652,334

(22) Filed: Feb. 24, 2022

(65) Prior Publication Data
US 2022/0285191 A1 Sep. 8, 2022

(30) Foreign Application Priority Data
Mar. 2, 2021 (JP) ................. 2021-032793

(51) Int. Cl.
*H01L 21/677* (2006.01)
*H01L 21/687* (2006.01)
*H01L 21/67* (2006.01)

(52) U.S. Cl.
CPC .. *H01L 21/67742* (2013.01); *H01L 21/67745* (2013.01); *H01L 21/68707* (2013.01); *H01L 21/67201* (2013.01)

(58) Field of Classification Search
CPC ......... H01L 21/67742; H01L 21/68707; H01L 21/67201
USPC .......................................... 414/941; 294/213
See application file for complete search history.

(56) References Cited

U.S. PATENT DOCUMENTS

| 10,118,266 | B2* | 11/2018 | Yamada | B23Q 7/046 |
| 11,565,402 | B2* | 1/2023 | Berger | B25J 9/104 |
| 11,764,092 | B2* | 9/2023 | Hatano | H01L 21/67196 |
| | | | | 414/222.13 |
| 2002/0182036 | A1* | 12/2002 | Lowrance | B25J 9/106 |
| | | | | 414/217 |
| 2018/0056463 | A1* | 3/2018 | Yamada | H01L 21/67709 |
| 2019/0348898 | A1* | 11/2019 | Frangen | B65G 54/02 |
| 2021/0249291 | A1* | 8/2021 | Raatz | H01L 21/67724 |
| 2022/0037181 | A1* | 2/2022 | Hatano | H01L 21/67742 |
| 2022/0130701 | A1* | 4/2022 | Hatano | H01L 21/67709 |
| 2022/0301921 | A1* | 9/2022 | Shindo | H01L 21/67196 |
| 2022/0415687 | A1* | 12/2022 | Hatano | H02K 41/031 |
| 2022/0415688 | A1* | 12/2022 | Hatano | B25J 11/0095 |

FOREIGN PATENT DOCUMENTS

| JP | H05-037771 U | 5/1993 |
| JP | 2005-317656 A | 11/2005 |
| KR | 10-2017-0106464 A | 9/2017 |
| KR | 10-2021-0020019 A | 2/2021 |

* cited by examiner

Primary Examiner — Gerald McClain
(74) Attorney, Agent, or Firm — Armstrong Teasdale LLP

(57) ABSTRACT

A substrate transfer device includes: a planar motor provided in a transfer chamber and including an array of coils, a transfer unit configured to move above the planar motor, and a controller configured to control supply of a current to the array of the coils, wherein the transfer unit includes a first base including an array of first magnets and configured to move above the planar motor, a second base including an array of second magnets and configured to move above the planar motor, the second base being arranged coaxially with the first base, and at least one arm configured to be extended or contracted by rotating the second base relative to the first base.

11 Claims, 7 Drawing Sheets

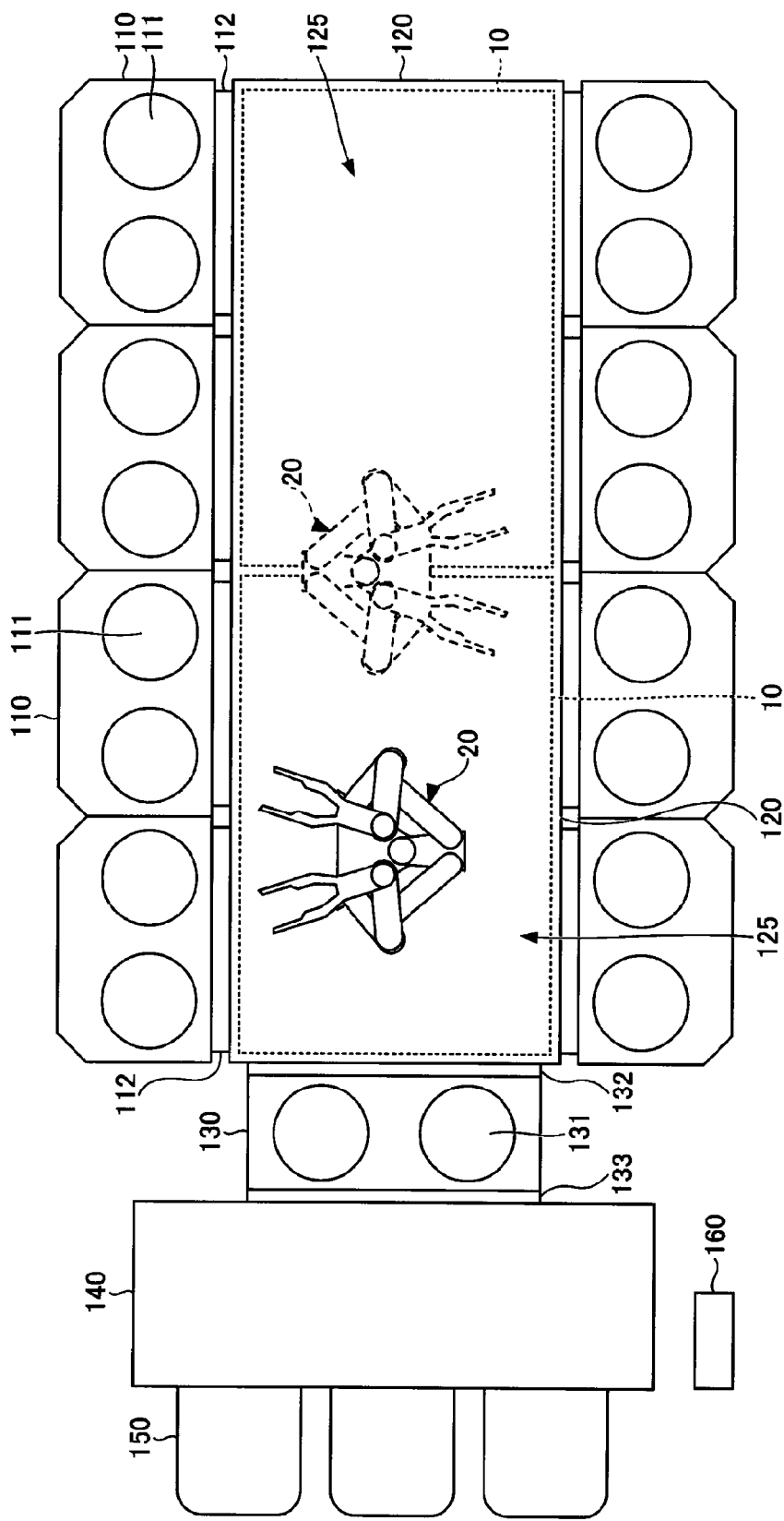

SUBSTRATE TRANSFER DEVICE AND SUBSTRATE PROCESSING SYSTEM

CROSS-REFERENCE TO RELATED APPLICATION

This application is based upon and claims the benefit of priority from Japanese Patent Application No. 2021-032793, filed on Mar. 2, 2021, the entire contents of which are incorporated herein by reference.

TECHNICAL FIELD

The present disclosure relates to a substrate transfer device and a substrate processing system.

BACKGROUND

For example, a substrate processing system including a plurality of processing chambers and a vacuum transfer chamber connected to the processing chambers is known. A substrate transfer device for transferring a substrate is provided inside the vacuum transfer chamber.

Patent Document 1 discloses a vacuum processing apparatus that transfers an object to be processed in a vacuum atmosphere and performs vacuum processing. The vacuum processing apparatus includes: a vacuum chamber whose interior can be set to a vacuum atmosphere; a moving body that moves inside the vacuum chamber and includes therein an airtight chamber that can be set to a normal pressure atmosphere; a transfer arm provided on an upper portion of the moving body to support and transfer the object to be processed; and an arm mechanism which includes therein an accommodating portion configured to accommodate therein cables and having a normal pressure atmosphere, wherein one end of the arm mechanism is connected to the moving body, the other end thereof is engaged with the vacuum chamber, and the accommodating portion communicates with the airtight chamber, so that the arm mechanism bends and stretches depending on the movement of the moving body.

PRIOR ART DOCUMENT

Patent Document

Patent Document 1: Japanese Laid-Open Patent Publication No. 2005-317656

In the vacuum processing apparatus disclosed in Patent Document 1, a motor for driving the transfer arm is disposed inside the airtight chamber of the moving body set to the normal pressure atmosphere. This requires a configuration in which the interior of the airtight chamber and the vacuum chamber are sealed. Further, a linear movement mechanism, such as a linear guide for moving a transfer base along a longitudinal direction of the chamber, a ball screw and the like is provided. This makes it difficult to maintain the interior of a transfer module at high vacuum. In addition, the size of the vacuum chamber may be increased.

SUMMARY

A substrate transfer device according to an aspect of the present disclosure includes: a planar motor provided in a transfer chamber and including an array of coils; a transfer unit configured to move above the planar motor; and a controller configured to control supply of a current to the array of the coils, wherein the transfer unit includes: a first base including an array of first magnets and configured to move above the planar motor; a second base including an array of second magnets and configured to move above the planar motor, the second base being arranged coaxially with the first base; and at least one arm configured to be extended/contracted by rotating the second base relative to the first base.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a plan view illustrating a configuration of another example of the substrate processing system.

DETAILED DESCRIPTION

Figure 1:
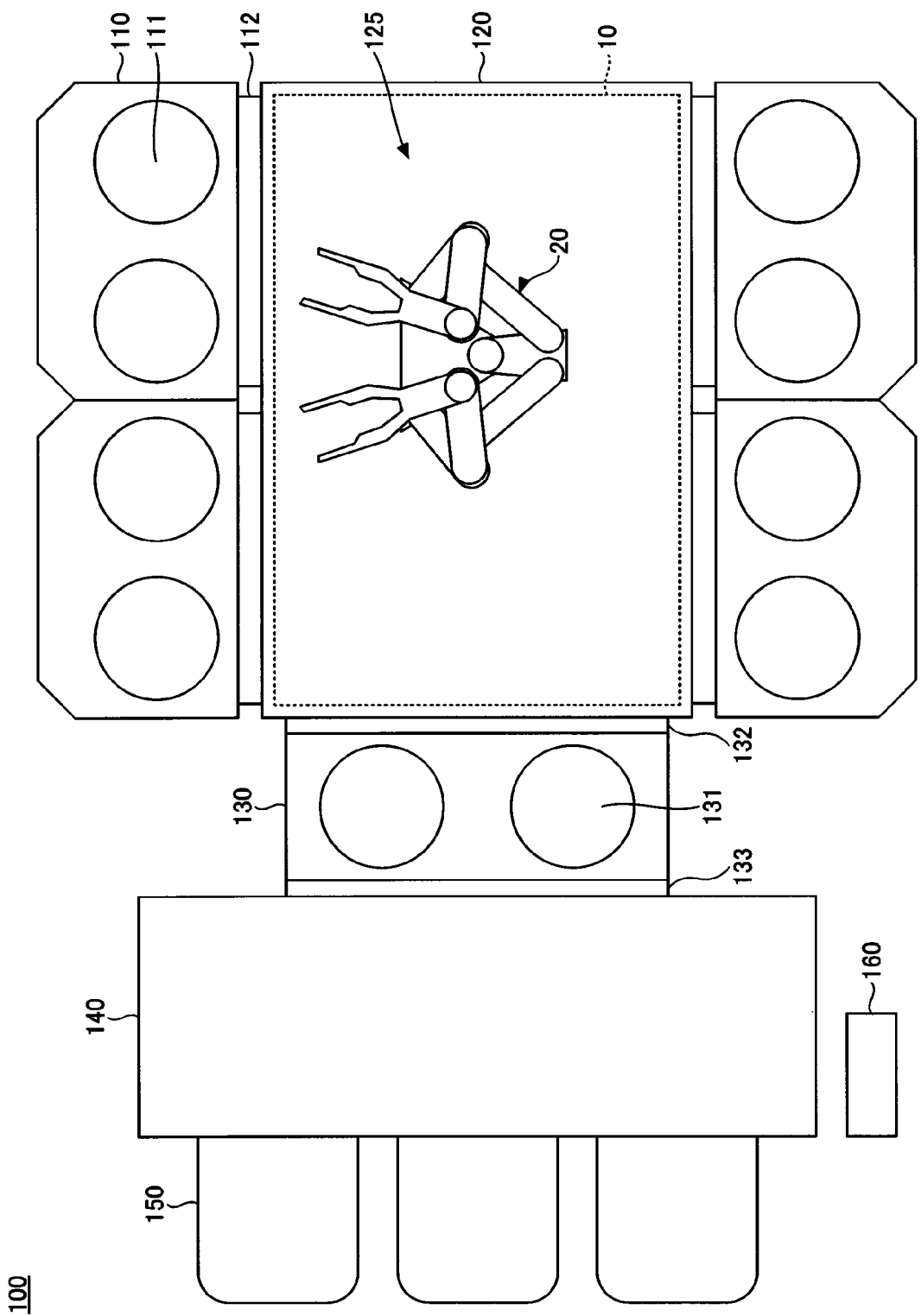
FIG. 1 is a plan view illustrating a configuration of an example of a substrate processing system according to an embodiment.

Hereinafter, embodiments for implementing the present disclosure will be described with reference to the accompanying drawings. In the accompanying drawings, the same components will be denoted by the same reference numerals, and redundant explanations thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing System 100>

First, an example of an overall configuration of a substrate processing system 100 according to an embodiment will be described with reference to FIG. 1. FIG. 1 is a plan view illustrating a configuration of an example of the substrate processing system 100 according to an embodiment.

The substrate processing system 100 illustrated in FIG. 1 is a system having a cluster structure (a multi-chamber type). The substrate processing system 100 includes a plurality of processing chambers 110, a vacuum transfer chamber 120, a load-lock chamber 130, an atmospheric transfer chamber 140, and a controller 160.

The processing chambers 110 are depressurized to a predetermined vacuum atmosphere. In the interior of each processing chamber, a desired process (e.g., an etching process, a film forming process, a cleaning process, an ashing process or the like) is performed on a semiconductor wafer W (hereinafter, also referred to as a "wafer W"). The processing chambers 110 are arranged adjacent to the vacuum transfer chamber 120. Each processing chamber 110 and the vacuum transfer chamber 120 communicate with each other by opening/closing a gate valve 112. Each processing chamber 110 includes a stage 111 on which the wafer W is placed. The operation of each part for processing in each processing chamber 110 is controlled by the controller 160.

The vacuum transfer chamber 120 is connected to a plurality of chambers (the processing chambers 110 and the load-lock chamber 130) via gate valves 112 and 132, and is depressurized to a predetermined vacuum atmosphere. In addition, inside the vacuum transfer chamber 120, a substrate transfer device 125 (a planar motor 10 and a transfer unit 20) for transferring the wafer W is provided. The substrate transfer device 125 includes picks 260A and 260B configured to hold the wafer W (see FIG. 2 described later). Here, when the picks 260A and 260B are not distinguished from each other, they may be simply expressed as the "pick 260." The substrate transfer device 125 performs loading and unloading of the substrate W between the processing chambers 110 and the vacuum transfer chamber 120 with the opening/closing of the gate valves 112. The substrate transfer device 125 performs loading and unloading of the substrate W between the load-lock chamber 130 and the vacuum transfer chamber 120 with the opening/closing of the gate valve 132. The operation of the substrate transfer device 125 and the opening and closing of the gate valves 112 and 132 are controlled by the controller 160. The substrate transfer device 125 will be described later with reference to FIGS. 2 to 4.

The load-lock chamber 130 is provided between the vacuum transfer chamber 120 and the atmospheric transfer chamber 140. The load-lock chamber 130 includes stages 131 on each of which the wafer W is placed. The load-lock chamber 130 is configured to switch between an air atmosphere and a vacuum atmosphere. The load-lock chamber 130 and the vacuum transfer chamber 120 in the vacuum atmosphere communicate with each other by the opening/closing of the gate valve 132. The load-lock chamber 130 and the atmospheric transfer chamber 140 in the air atmosphere communicate with each other by the opening and closing of a door valve 133. The switching between the vacuum atmosphere and the air atmosphere in the load-lock chamber 130 is controlled by the controller 160.

The atmospheric transfer chamber 140 is in the air atmosphere. For example, down-flow of clean air is formed inside the atmospheric transfer chamber 140. Inside the atmospheric transfer chamber 140, a transfer device (not illustrated) for transferring the wafer W is provided. The transfer device (not illustrated) performs loading and unloading of the wafer W between the load-lock chamber 130 and the atmospheric transfer chamber 140 with the opening and closing of the door valve 133. The operation of the transfer device (not illustrated) and the opening/closing of the door valve 133 are controlled by the controller 160.

Load ports 150 are provided on a wall surface of the atmospheric transfer chamber 140. A carrier (not illustrated) in which the wafer W is accommodated or an empty carrier is attached to each load port 150. As the carrier, for example, a front opening unified pod (FOUP) or the like may be used.

The transfer device (not illustrated) may take out the wafer W accommodated in the carrier attached to the load port 150 and place the same on the stage 131 of the load-lock chamber 130. In addition, the transfer device (not illustrated) may take out the wafer W placed on the stage 131 of the load-lock chamber 130 and accommodate the same in the carrier attached to the load port 150.

The controller 160 includes a central processing unit (CPU), a read only memory (ROM), a random access memory (RAM), and a hard disk drive (HDD). The controller 160 is not limited to the HDD and may include a different storage area such as a solid state drive (SSD). A recipe in which process procedures, process conditions, and transfer conditions are set is stored in a storage area such as the HDD, the RAM or the like.

The CPU controls the processing of the wafer W in each processing chamber 110 according to the recipe, and controls the transfer of the wafer W. The HDD or RAM may store a program for executing the processing of the wafer W or the transfer of the wafer W in each processing chamber 110. The program may be provided in the state of being stored in a storage medium, or may be provided from an external device via a network.

Next, an example of the operation of the substrate processing system 100 will be described. Here, as an example of the operation of the substrate processing system 100, an operation of processing the wafer W accommodated in the carrier attached to the load port 150 in the processing chamber 110 and accommodating the wafer W in an empty carrier attached to the load port 150 will be described. At the start of the operation, the gate valves 112 and 132 and the door valve 133 are closed, and the interior of the load-lock chamber 130 is in the air atmosphere.

The controller 160 opens the door valve 133. The controller 160 controls the transfer device in the atmospheric transfer chamber 140 to take out the wafer W from the carrier of the load port 150 and place the wafer W on the stage 131 of the load-lock chamber 130. When the wafer W is placed on the stage 131 of the load-lock chamber 130 and the transfer device is withdrawn from the load-lock chamber 130, the controller 160 closes the door valve 133.

The controller 160 controls an exhaust device (not illustrated) of the load-lock chamber 130 to exhaust air in the interior of the load-lock chamber 130 so that the load-lock chamber 130 is switched from the air atmosphere to the vacuum atmosphere.

Subsequently, the wafer W placed on the stage 131 of the load-lock chamber 130 is transferred to the processing chamber 110 and placed on the stage 111. Specifically, the controller 160 opens the gate valve 132. The controller 160 controls the substrate transfer device 125 (to be described later) to insert the pick 260 into the load-lock chamber 130 up to a preset delivery position, to hold the wafer W placed on the stage 131 of the load-lock chamber 130, and to transfer the wafer W to the vacuum transfer chamber 120. When the pick 260 is withdrawn from the load-lock chamber 130, the controller 160 closes the gate valve 132.

The controller 160 opens the gate valve 112 of the processing chamber 110 corresponding to a transfer destination. The controller 160 controls the substrate transfer device 125 to insert the pick 260 into the processing chamber 110 up to a preset delivery position, and to place the held wafer W on the stage 111 of the processing chamber 110. When the pick 260 is withdrawn from the processing chamber 110, the controller 160 closes the gate valve 112.

The controller 160 controls the processing chamber 110 to perform a desired process on the wafer W.

Upon completing the processing of the wafer W, the wafer W placed on the stage 111 of the processing chamber 110 is transferred to the load-lock chamber 130 and placed on the stage 131. Specifically, the controller 160 opens the gate valve 112. The controller 160 controls the substrate transfer device 125 to insert the pick 260 into the processing chamber 110 up to a preset delivery position, to hold the wafer W placed on the stage 111 of the processing chamber 110, and to transfer the wafer W to the vacuum transfer chamber 120. When the pick 260 is withdrawn from the processing chamber 110, the controller 160 closes the gate valve 112.

The controller 160 opens the gate valve 132. The controller 160 controls the substrate transfer device 125 to insert the pick 260 into the load-lock chamber 130 up to a preset delivery position, and to place the held wafer W on the stage 131 of the load-lock chamber 130. When the pick 260 is withdrawn from the load-lock chamber 130, the controller 160 closes the gate valve 132.

The controller 160 controls a gas supply apparatus (not illustrated) of the load-lock chamber 130 to supply clean air into the load-lock chamber 130, so that the load-lock chamber 130 is switched from the vacuum atmosphere to the air atmosphere.

The controller 160 opens the door valve 133. The controller 160 controls a transfer device (not shown) to take out the wafer W placed on the stage 131 of the load-lock chamber 130 and to accommodate the same in the carrier of the load port 150. When the wafer W is taken out from the stage 131 of the load-lock chamber 130 and the transfer device (not illustrated) is withdrawn from the load-lock chamber 130, the controller 160 closes the door valve 133.

In the substrate processing system 100, the substrate transfer device 125 has been described by taking, as an example, the configuration in which the wafer W placed on the stage 131 of the load-lock chamber 130 is transferred to the stage 111 of the processing chamber 110 and the processed wafer W is transferred from the stage 111 of the processing chamber 110 to the stage 131 of the load-lock chamber 130, but the present disclosure is not limited thereto. The substrate transfer device 125 may be configured to transfer the wafer W placed on the stage 111 of one processing chamber 110 to the stage 111 of another processing chamber 110.

<Substrate Transfer Device 125>

Figure 2:
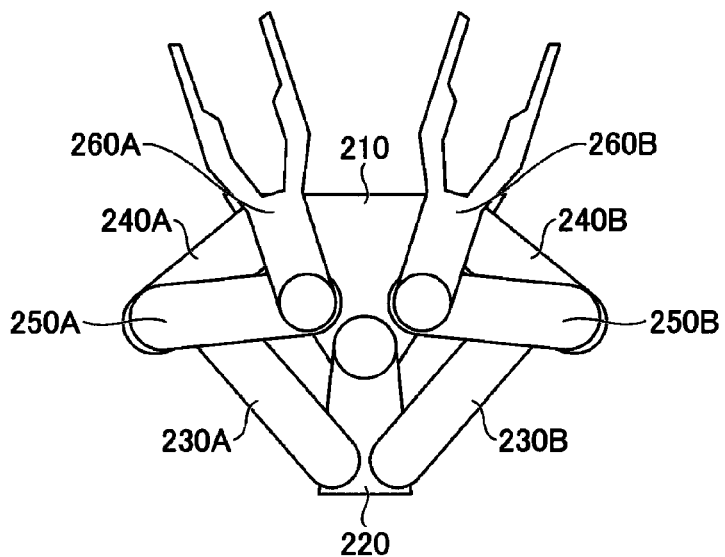
FIG. 2 is a plan view illustrating an example of a transfer unit according to an embodiment.
Figure 3:
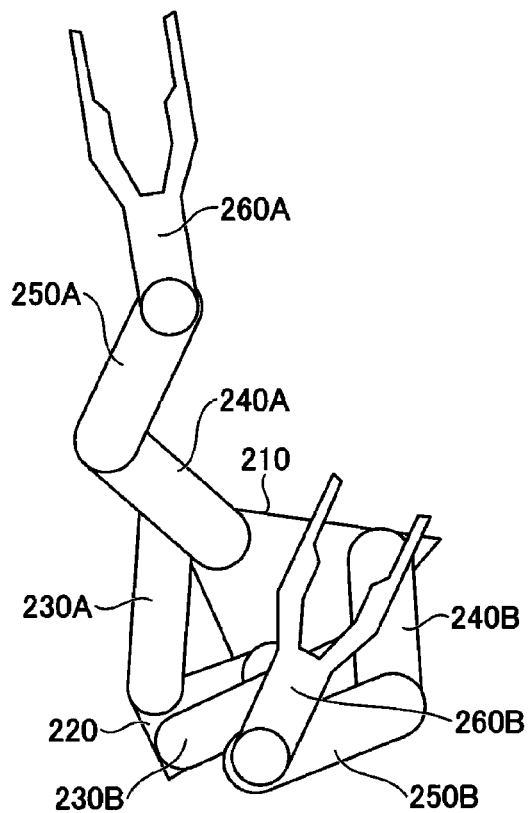
FIG. 3 is a plan view illustrating an example of a transfer unit according to an embodiment.
Figure 4:
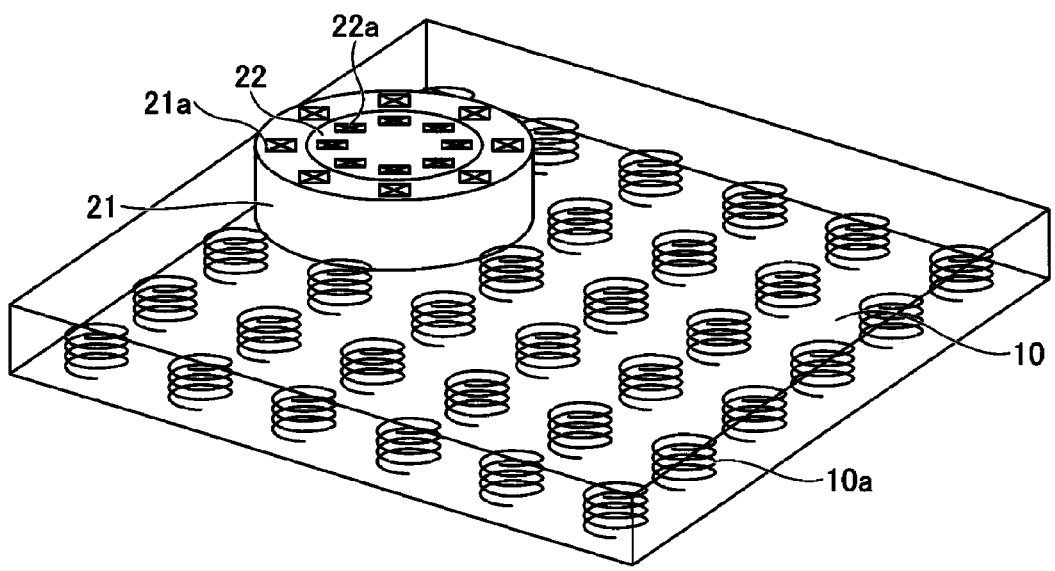
FIG. 4 is a perspective view for explaining a driving principle of a substrate transfer mechanism.

Next, the substrate transfer device 125 will be further described with reference to FIGS. 2 to 4. FIGS. 2 and 3 are plan views illustrating an example of the transfer unit 20 according to an embodiment. Further, FIG. 2 illustrates an example of the posture of the transfer unit 20. FIG. 3 illustrates another example of the posture of the transfer unit 20.

The substrate transfer device 125 includes the planar motor (a linear unit) 10 arranged in the vacuum transfer chamber 120 and the transfer unit 20 that is movable on the planar motor 10.

The transfer unit 20 includes two bases (first bases) 21 and a base (second base) 22 (see FIG. 4 to be described later), a base mount 210, a drive arm 220, links 230A, 230B, 240A, 240B, 250A, and 250B, and the picks 260A and 260B.

One end of the drive arm 220 is rotatably connected to the base mount 210. The other end of the drive arm 220 and one end of the link 230A are rotatably connected to each other. The other end of the link 230A is rotatably connected to the central portion of the link 240A (between a joint between the base mount 210 and the link 240A and a joint between the link 240A and the link 250A). In addition, one end of the link 240A is rotatably connected to the base mount 210. As a result, the base mount 210, the drive arm 220, the link 230A, and the link 240A form a four-node link mechanism. The four-node link mechanism is configured such that the link 240A can be rotated relative to the base mount 210 by rotating the drive arm 220 relative to the base mount 210.

The link 240A, the link 250A, and the pick 260A form a first arm. One end of the link 240A is rotatably connected to the base mount 210. The other end of the link 240A and one end of the link 250A are rotatably connected to each other. The other end of the link 250A and a base portion of the pick 260A are rotatably connected to each other. The pick 260A includes a holder configured to hold the wafer W. The joint between the base mount 210 and the link 240A, the joint between the link 240A and the link 250A, and a joint between the link 250A and the pick 260A are connected by a timing belt (not illustrated), respectively. Thus, when one joint is moved, other joints may move in conjunction with the movement of the one joint. As a result, the first arm can be extended/contracted (see FIGS. 2 and 3) by rotating the link 240A relative to the base mount 210. That is, the first arm can be extended/contracted (see FIGS. 2 and 3) with the rotating operation of the drive arm 220.

Similarly, the other end of the drive arm 220 and one end of the link 230B are rotatably connected to each other. The other end of the link 230B is rotatably connected to the central portion of the link 240B (between a joint between the base mount 210 and the link 240B and a joint between the link 240B and the link 250B). In addition, one end of the link 240B is rotatably connected to the base mount 210. As a result, the base mount 210, the drive arm 220, the link 230B, and the link 240B form a four-node link mechanism. The four-node link mechanism is configured such that the link 240B can be rotatable relative to the base mount 210 by rotating the drive arm 220 relative to the base mount 210.

Similarly, the link 240B, the link 250B, and the pick 260B form a second arm. One end of the link 240B is rotatably connected to the base mount 210. The other end of the link 240B and one end of the link 250B are rotatably connected to each other. The other end of the link 250B and a base portion of the pick 260B are rotatably connected to each other. The pick 260B includes a holder configured to hold the wafer W. The joint between the base mount 210 and the link 240B, the joint between the link 240B and the link 250B, and a joint between the link 250B and the pick 260B are connected by a timing belt (not illustrated), respectively. Thus, when one joint is moved, other joints move in conjunction with the movement of the one joint. As a result, the second arm can be extended/contracted by rotating the link 240B relative to the base mount 210. That is, the second arm can be extended/contracted with the rotating operation of the drive arm 220.

In addition, the transfer unit 20 is configured such that when one of the first arm and the second arm is extended, the other arm is contracted.

Next, the planar motor 10 and the bases 21 and 22 of the transfer unit 20 will be further described with reference to FIG. 4. FIG. 4 is a perspective view illustrating the driving principle of the substrate transfer device 125.

In the planar motor 10, a plurality of coils 10a are arranged. The coils 10a generate magnetic fields by being supplied with a current. The controller 160 (see FIG. 1) is configured to be able to individually control current values to be supplied to the coils 10a.

The base 21 is formed in, for example, an annular shape. In addition, the base 21 is connected to the base mount 210 (see FIGS. 2 and 3). A plurality of permanent magnets (first magnets) 21a are arranged on the base 21. By the magnetic fields generated by the coils 10a, the base 21 magnetically floats on the planar motor 10. In addition, the base 21 moves and rotates above the planar motor 10 by the magnetic fields generated by the coils 10a.

The base 22 is formed in, for example, a cylindrical shape and arranged inward of the annular base 21. The base 22 is arranged coaxially with the base 21 and arranged to be rotatable relative to the base 21. The base 22 penetrates the base mount 210 and is connected to the drive arm 220 (see FIGS. 2 and 3). A plurality of permanent magnets (second magnets) 22a are arranged on the base 22. By the magnetic fields generated by the coils 10a, the base 22 magnetically floats on the planar motor 10. In addition, the base 22 moves and rotates over the planar motor 10 by the magnetic fields generated by the coils 10a.

With such a configuration, the controller 160 (see FIG. 1) is configured to be capable of controlling the position, orientation, and floating amount of the bases 21 and 22 by controlling the current value to be supplied to each coil 10a of the planar motor 10. The controller 160 is configured to be capable of rotating the base 22 relative to the base 21 by controlling the current value to be supplied to each coil 10a of the planar motor 10.

Figure 5:
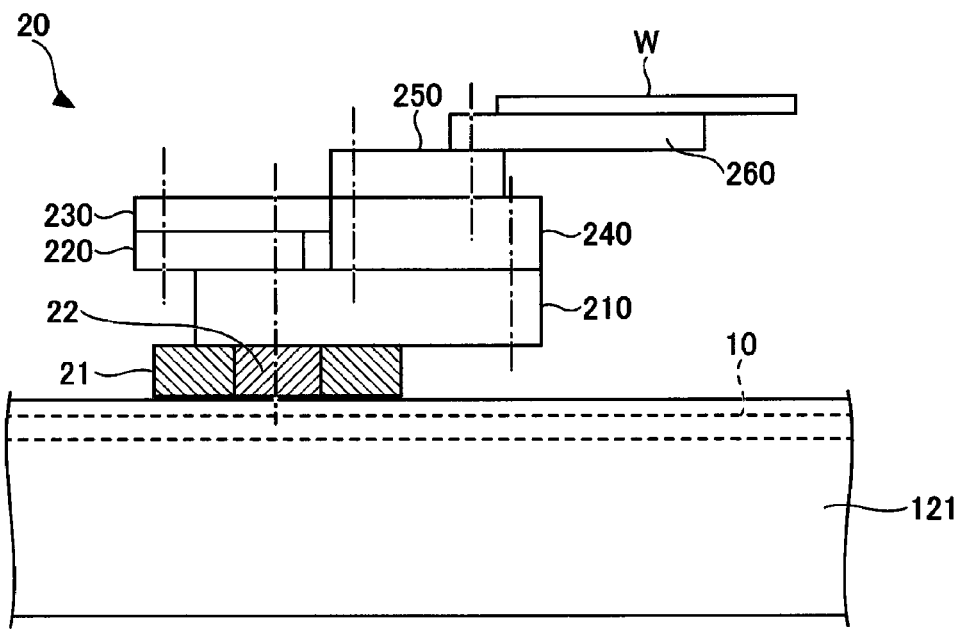
FIG. 5 is an example of a schematic side view of a substrate transfer device.

FIG. 5 is an example of a schematic side view of the substrate transfer device 125. The bases 21 and 22 are illustrated in the form of a cross-sectional view. In addition, a rotation axis of each joint is indicated by an alternate long and short dash line.

The planar motor 10 is provided on a floor portion 121 of the vacuum transfer chamber 120. The planar motor 10 may be arranged in the space of an air atmosphere via a floor wall surface of the vacuum transfer chamber 120 under a vacuum atmosphere. As a result, heat generated when the current is supplied to the coils 10a can be released to the air. In this case, the floor wall surface of the vacuum transfer chamber 120 is made of a material that allows magnetic fields to pass therethrough.

Here, the base 21 is connected to the base mount 210. Further, the base 22 is connected to the drive arm 220.

The controller 160 (see FIG. 1) can move and rotate the transfer unit 20 above the planar motor 10 by controlling the position, orientation, and floating amount of the bases 21 and 22. That is, by rotating the bases 21 and 22 in the same direction and at the same rotational speed, the transfer unit 20 can be swiveled. In addition, by moving the bases 21 and 22 in the same direction and at the same speed, the transfer unit 20 can be moved.

Furthermore, the controller 160 (see FIG. 1) can rotate the base 22 relative to the base 21, in other words, rotate the drive arm 220 relative to the base mount 210 by controlling the position, orientation, and floating amount of the bases 21 and 22. This makes it possible to extend/contract the first arm and the second arm. An amount of extension/contraction of the first arm and the second arm is controlled by the rotation of the base 22 relative to the base 21. The orientation in which the first arm and the second arm are extended is controlled by the orientation of the base mount 210 (the bases 21 and 22 are rotated in the same direction and at the same rotational speed).

In addition, the controller 160 (see FIG. 1) can move the transfer unit 20 up and down, in other words, can move the pick 260 up and down by controlling the floating amount of the bases 21 and 22. This makes it possible to perform, for example, the operation of delivering the wafer W held by the pick 260 to the stage 111, the operation of receiving the wafer W from the stage 111 by the pick 260, and the like.

A plurality of transfer units 20 may be provided inside the vacuum transfer chamber 120. In this case, the wafer W can be delivered between the plurality of transfer units 20 by lowering one transfer unit 20 that holds the wafer W with the pick 260 and/or raising another transfer unit 20 that receives the wafer W with the pick 260.

Figure 6:
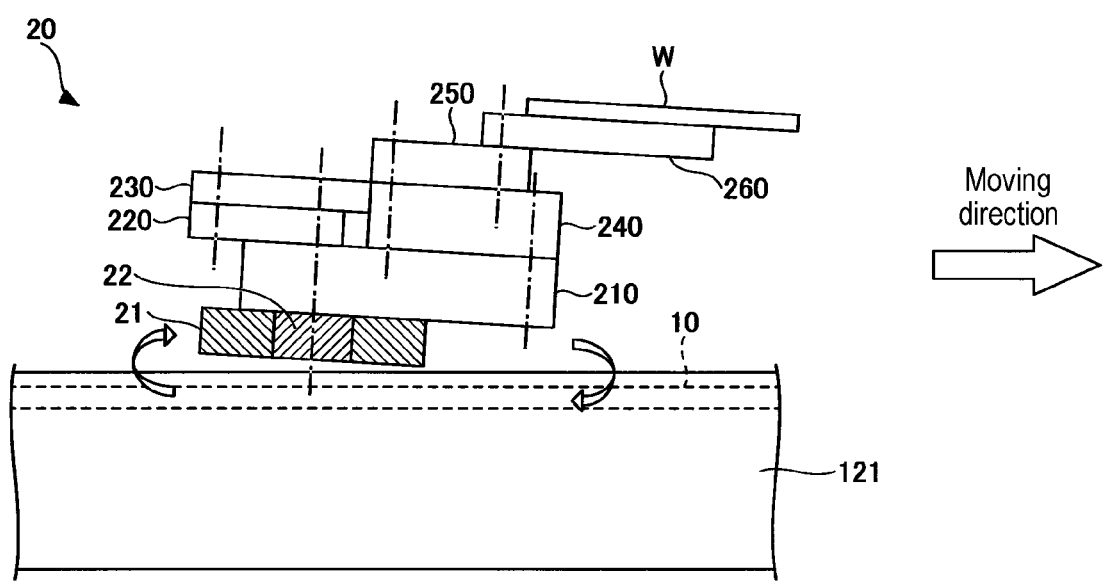
FIG. 6 is an example of a side view of the substrate transfer device at the time of transferring a wafer.

FIG. 6 is an example of a side view of the substrate transfer device 125 at the time of transferring the wafer W. As illustrated by the white arrow in FIG. 6, the floating amount may be controlled at front and rear sides in the movement direction of the transfer unit 20 to tilt and move the transfer unit 20. For example, at the time of acceleration, the floating amount at the front side in the movement direction of the transfer unit 20 may be smaller than that at the rear side. As a result, the transfer unit 20 may be in a tilted posture toward the front direction, and the pick 260 may also be in a tilted posture toward the front direction.

Here, it is assumed that the inertial force at the time of transferring the wafer W is F and the tilt angle of the transfer unit 20 is θ. In the transfer unit 20 in the tilted posture toward the front direction, the inertial force F at the time of transferring the wafer W may have a component perpendicular to a placement surface of the pick 260 (Fsin θ) and a component horizontal to the placement surface of the pick 260 (Fcos θ). This makes it possible to reduce the component horizontal to the placement surface of the pick 260 compared with the transfer unit 20 (see FIG. 5) that horizontally carries the wafer W. In other words, at the time of transferring the wafer W, it is possible to move the transfer unit 20 at a higher speed while preventing the wafer W from being displaced.

Although the transfer unit 20 has been described to be titled toward the front direction during acceleration, it may be titled backward during deceleration.

As described above, according to the substrate transfer device 125 of the present embodiment, it is possible to control the operation of the transfer unit 20 (the movement, rotation, and tilting of the transfer unit 20, and the extension/contraction of the arm). Through such a control, it is possible to transfer the wafer W.

In addition, according to the substrate transfer device 125 of the present embodiment, a rotary motor for driving the first arm and the second arm, an airtight chamber arranged inside the vacuum transfer chamber 120 and accommodating the rotary motor in an air atmosphere, and a sealing member for the airtight chamber may be omitted. This makes it possible to omit the rotary motor or the like to be arranged inside the vacuum transfer chamber 120, which reduces the height of the transfer unit 20. In addition, it is possible to eliminate, for example, a rotary shaft of the rotary motor that penetrates a wall surface that separates the interior of the vacuum transfer chamber 120 in a vacuum atmosphere and the space in an air atmosphere (e.g., the airtight chamber) from each other. Thus, it is possible to improve a vacuum level inside the vacuum transfer chamber 120.

In addition, it is possible to reduce the number of cables connected to the rotary motor and duct arms to be accommodated. This makes it possible to reduce the height of the vacuum transfer chamber 120.

According to the substrate transfer device 125 of the present embodiment, it is possible to omit the linear movement mechanism (e.g., the linear guide and the ball screw) configured to move the transfer unit in the longitudinal direction of the vacuum transfer chamber 120. This makes it possible to prevent particles (e.g., grease, wear debris, and the like) from being generated from the linear guide, the ball screw, and the like which are exposed to the vacuum atmosphere. According to the substrate transfer device 125 of the present embodiment, since the transfer unit 20 can be moved while being magnetically floated, the generation of particles can be further reduced.

Figure 7:
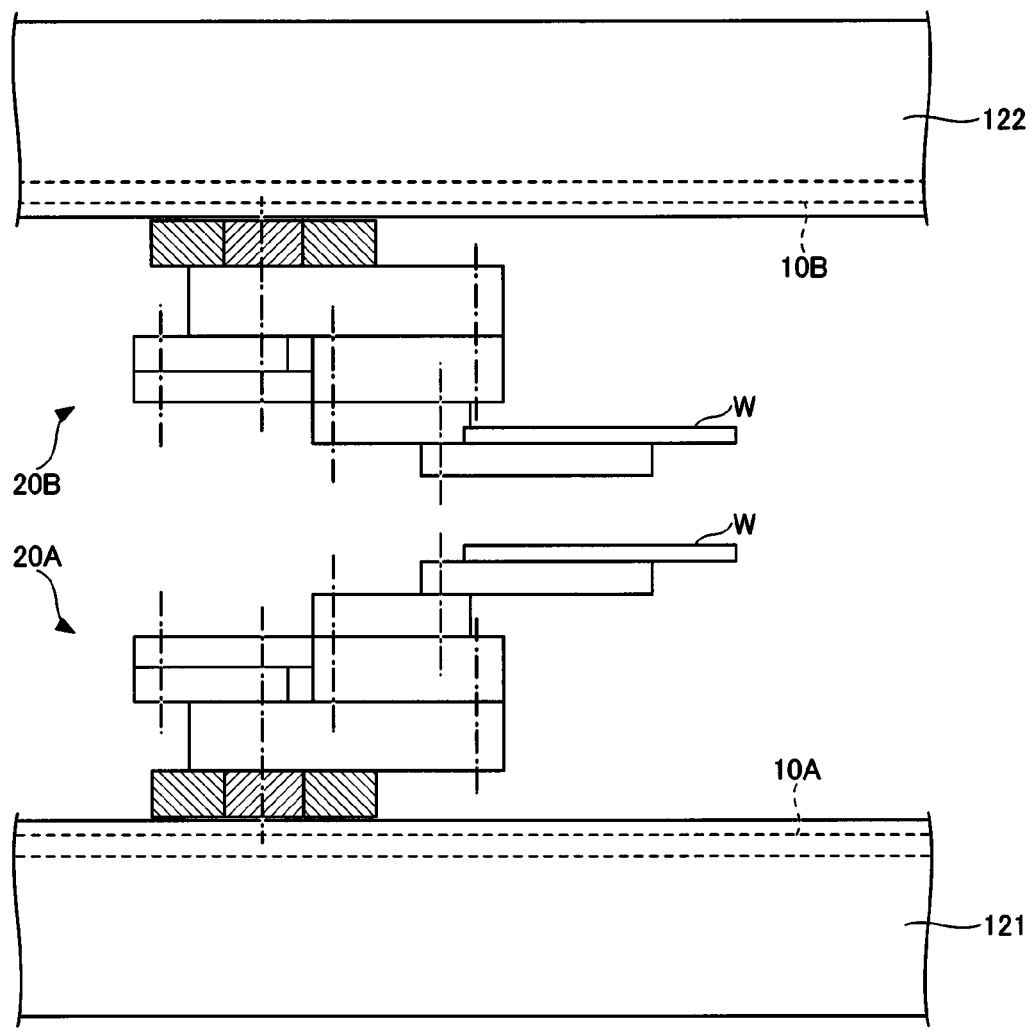
FIG. 7 is a side view of another example of the substrate transfer device.
Figure 8:
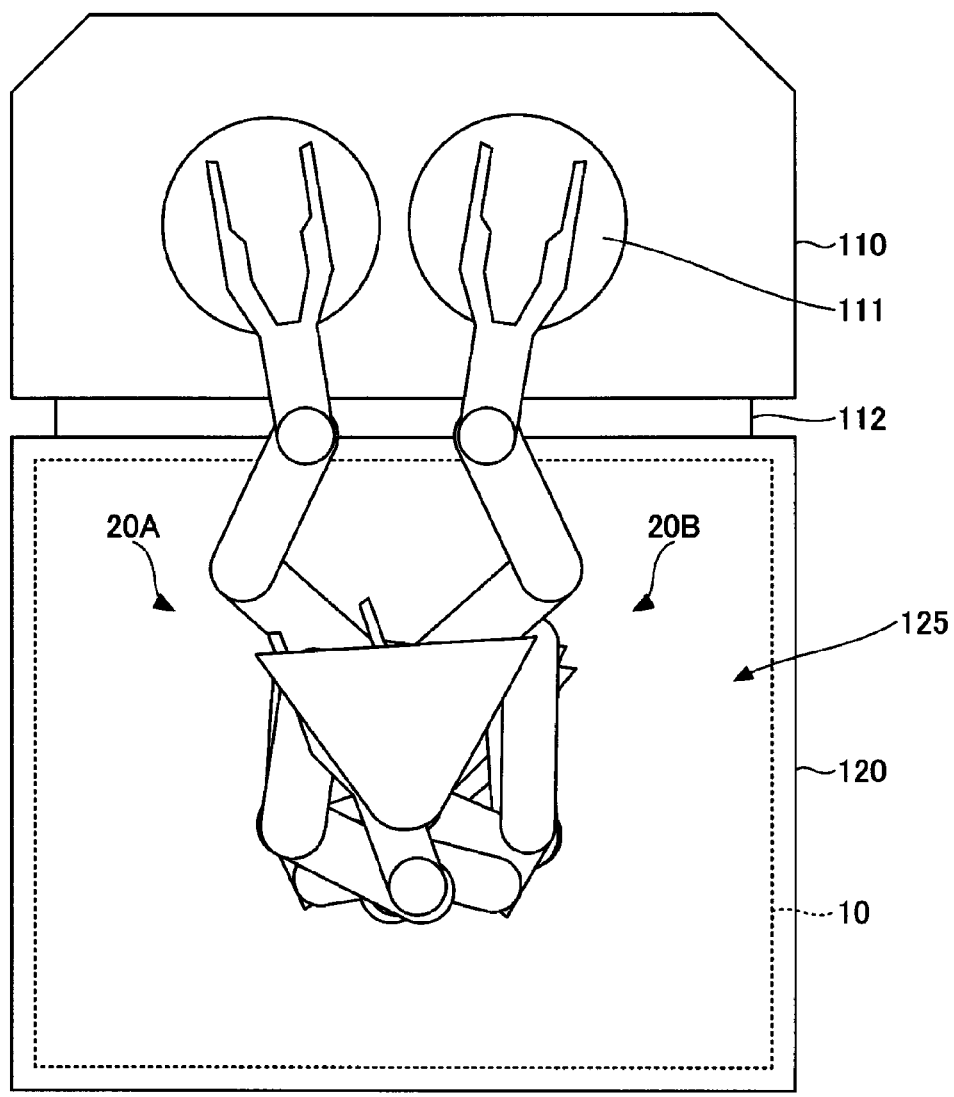
FIG. 8 is a plan view of another example of the substrate transfer device.

Although the configuration in which the planar motor 10 is provided on the floor portion 121 of the vacuum transfer chamber 120 and the transfer unit 20 moves above the floor portion 121 has been described as an example, the present disclosure is not limited thereto. FIG. 7 is a side view of another example of the substrate transfer device 125. FIG. 8 is a plan view of another example of the substrate transfer device 125.

As illustrated in FIG. 7, in the vacuum transfer chamber 120, a planar motor (a first planar motor) 10A is provided on the floor portion 121, and a transfer unit (a first transfer unit) 20A moves above the floor portion 121. In the vacuum transfer chamber 120, a planar motor (a second planar motor) 10B is provided on the ceiling portion 122, and a transfer unit (a second transfer unit) 20B moves along the ceiling portion 122. In addition, the transfer unit 20B is magnetically attracted by the planar motor 10B of the ceiling portion 122, and thus floats with a gap from the ceiling portion 122.

As a result, as illustrated in FIG. 8, simultaneously with one pick of the transfer unit 20A in the floor portion 121 being inserted into a processing chamber 110, one pick of the transfer unit 20B in the ceiling portion 122 may be inserted into the processing chamber 110. This makes it possible to deliver or receive two wafers W in a simultaneous manner. Thus, it is possible to reduce the time required for transferring the wafers W.

The operations of the transfer units 20A and 20B are not limited to the above. For example, of the transfer units 20A and 20B, an arm of one transfer unit may be used to receive a processed wafer W from the stage 111, and an arm of the other transfer unit may be used to deliver an unprocessed wafer W to the stage 111. This makes it possible to perform the reception and delivery of the wafers W by opening the gate valve 112 once, which reduces the time required for transferring the wafers W.

FIG. 9 is a plan view illustrating a configuration of another example of the substrate processing system. In the substrate processing system illustrated in FIG. 9, two vacuum transfer chambers 120 are connected to each other. Four processing chambers 110 are connected to each vacuum transfer chamber 120. In FIG. 9, as indicated by broken lines, a transfer unit 20 is movable between the two vacuum transfer chambers 120. The transfer unit 20 can be moved from above a planar motor 10 of one vacuum transfer chamber 120 to a planar motor 10 of the other vacuum transfer chamber 120. This makes it possible for the substrate transfer device 125 to be compatible with various layouts of the substrate processing system. For example, even when an additional vacuum transfer chamber 120 is provided later, the transfer unit 20 can be moved to the additional vacuum transfer chamber 120 so that the wafer W can be moved to a processing chamber 110 adjacent to the additional vacuum transfer chamber 120.

While the substrate processing system 100 has been described above, the present disclosure is not limited thereto, but may be modified and improved in various forms within the scope of the technical idea recited in the claims.

According to an aspect of the present disclosure, it is possible to provide a substrate transfer device and a substrate processing system for transferring a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transfer device comprising:
 a planar motor provided in a transfer chamber and including an array of coils;
 a transfer unit configured to move above the planar motor; and
 a controller configured to control supply of a current to the array of the coils,
 wherein the transfer unit includes:
 a first base including an array of first magnets and configured to move above the planar motor;
 a second base including an array of second magnets and configured to move above the planar motor, the second base being arranged coaxially with the first base; and
 at least one arm configured to be extended or contracted by rotating the second base relative to the first base.

2. The substrate transfer device of claim 1, wherein the transfer unit includes:
 a base mount connected to the first base;
 a drive arm connected to the second base and configured to be rotatable relative to the base mount; and
 the at least one arm configured to be further extended or contracted with an operation of the drive arm.

3. The substrate transfer device of claim 2, wherein the at least one arm of the transfer unit includes a pair of arms, and
 one arm of the pair of arms is extended and the other arm of the pair of arms is contracted with the operation of the drive arm.

4. The substrate transfer device of claim 3, wherein the at least one arm includes a pick configured to hold a substrate, and
 the controller is further configured to control floating amounts of the first base and the second base to raise and lower the pick.

5. The substrate transfer device of claim 4, wherein the controller is further configured to control, when moving the transfer unit, the floating amounts of the first base and the second base to cause the first base and the second base to be tilted so as to tilt the pick.

6. The substrate transfer device of claim 1, wherein the at least one arm includes a pick configured to hold a substrate, and
 the controller is further configured to control floating amounts of the first base and the second base to raise and lower the pick.

7. A substrate processing system comprising:
 a plurality of chambers;
 a transfer chamber connecting the plurality of chambers; and
 the substrate transfer device provided with a planar motor provided in the transfer chamber and including an array of coils; a transfer unit configured to move above the planar motor; and a controller configured to control supply of a current to the array of the coils, wherein the transfer unit includes: a first base including an array of first magnets and configured to move above the planar motor; a second base including an array of second magnets and configured to move above the planar motor, the second base being arranged coaxially with the first base; and at least one arm configured to be extended or contracted by rotating the second base relative to the first base.

8. The substrate processing system of claim 7, wherein the transfer chamber is a vacuum transfer chamber in a vacuum atmosphere.

9. The substrate processing system of claim 8, wherein the planar motor is arranged in a space in an air atmosphere through a wall surface of the vacuum transfer chamber.

10. The substrate processing system of claim 9, wherein the planar motor includes:
a first planar motor arranged on a floor portion of the transfer chamber; and
a second planar motor arranged on a ceiling portion of the transfer chamber, and
wherein the transfer unit includes:
a first transfer unit configured to move above the first planar motor; and
a second transfer unit configured to move above the second planar motor.

11. The substrate processing system of claim 7, wherein the planar motor includes:
a first planar motor arranged on a floor portion of the transfer chamber; and
a second planar motor arranged on a ceiling portion of the transfer chamber, and
wherein the transfer unit includes:
a first transfer unit configured to move above the first planar motor; and
a second transfer unit configured to move above the second planar motor.

\* \* \* \* \*